United States Patent
Lei et al.

(10) Patent No.: US 10,701,816 B2
(45) Date of Patent: Jun. 30, 2020

(54) MULTI-PANEL DISPLAY DEVICE

(71) Applicant: Unilumin Group Co., Ltd., Shenzhen (CN)

(72) Inventors: Song Lei, Shenzhen (CN); Shengqi Lu, Shenzhen (CN); Pinglin Zhao, Shenzhen (CN)

(73) Assignee: Unilumin Group Co., LTD., Shenzhen (CN)

( * ) Notice: Subject to any disclaimer, the term of this patent is extended or adjusted under 35 U.S.C. 154(b) by 0 days.

(21) Appl. No.: 16/410,351

(22) Filed: May 13, 2019

(65) Prior Publication Data

US 2020/0029446 A1     Jan. 23, 2020

(30) Foreign Application Priority Data

Jul. 19, 2018 (CN) .......................... 2018 1 0798302

(51) Int. Cl.
*H05K 5/00* (2006.01)
*B66F 11/00* (2006.01)
*H05K 5/02* (2006.01)

(52) U.S. Cl.
CPC ............ *H05K 5/0017* (2013.01); *B66F 11/00* (2013.01); *H05K 5/0021* (2013.01); *H05K 5/0217* (2013.01)

(58) Field of Classification Search
CPC .. H05K 5/0017; H05K 5/0021; H05K 5/0217; B66F 11/00; Y10S 248/917;

(Continued)

(56) References Cited

U.S. PATENT DOCUMENTS

| | | | | |
|---|---|---|---|---|
| 5,537,127 A | * | 7/1996 | Jingu | A47B 21/00 |
| | | | | 248/921 |
| 2014/0367597 A1 | * | 12/2014 | Courth | B60T 8/363 |
| | | | | 251/129.15 |

FOREIGN PATENT DOCUMENTS

| CN | 102444765 A | 5/2012 |
|---|---|---|
| CN | 202332132 U | 7/2012 |

(Continued)

OTHER PUBLICATIONS

Office Action dated Jan. 14, 2020 in corresponding Chinese case CN10798302.6.

(Continued)

*Primary Examiner* — Jayprakash N Gandhi
*Assistant Examiner* — Hung Q Dang
(74) *Attorney, Agent, or Firm* — Dinsmore & Shohl LLP

(57) ABSTRACT

The present invention relates to a display device comprising a mounting board and a display panel mounted on the mounting board and comprising a plurality of display modules arranged in an array, and further comprising a control module and a plurality of driving modules corresponding to the display modules. The control module is capable of controlling the driving modules to drive the corresponding display modules to extend. When the display device is powered on, the control module is electrically coupled to the driving module such that the driving module receives a signal from the control module and controls the display module to extend in response to the signal; when the driving module is started, the corresponding display module moves along with the driving module and automatically extends, facilitating the maintenance of the display device.

8 Claims, 6 Drawing Sheets

(58) Field of Classification Search
CPC .......... G09F 9/3026; A47B 2097/005; G09G 2300/023; G09G 2300/026
See application file for complete search history.

(56) References Cited

FOREIGN PATENT DOCUMENTS

| | | |
|---|---|---|
| CN | 103985319 A | 8/2014 |
| CN | 203982736 U | 12/2014 |
| CN | 204632279 U | 9/2015 |
| CN | 105023523 A | 11/2015 |
| GB | 2504183 A | 1/2014 |
| KR | 101452110 B1 | 10/2014 |
| WO | 2017/216366 A1 | 12/2017 |

OTHER PUBLICATIONS

Search results dated Jan. 16, 2020 in corresponding Chinese case CN10789302.6.
European Search Report for Application No. 19167032.2-1201 dated Oct. 9, 2019, 9 pages.

\* cited by examiner

MULTI-PANEL DISPLAY DEVICE

CROSS REFERENCE TO RELATED APPLICATIONS

This application claims priority to Chinese Patent Application 201810798302.6 filed Jul. 19, 2018 the content of which is incorporated herein by reference in its entirety.

FIELD OF THE INVENTION

The present invention relates to the field of light emitting diode (LED) display technology, and more particularly to a display device.

BACKGROUND OF THE INVENTION

With the upgrading of LED display products, the integrated display device has the characteristics of small size and convenient installation. The display device is generally mounted on the wall, which has become the popular way to mount the LED display screen. Since the LED display screen is mounted on the wall, the previous ways to maintain it from the back are no longer applicable.

For the maintenance of such LED display screen, maintenance is performed in front of the screen. However, the display devices used in the prior art include an iron piece is disposed at the rear of the module and the module may be drawn out with a large magnet. Such arrangement of the device leads to a complicated operation and likelihood of damage to the LED, and requires manual maintenance due to its inability to perform automatic maintenance.

SUMMARY OF THE INVENTION

For the stated reasons, it is necessary to provide a display device that is capable of performing automatic maintenance and that is simple to operate.

A display device comprising a mounting board and a display panel mounted on the mounting board and comprising a plurality of display modules arranged in an array, wherein:

the display device further comprises a control module and a plurality of driving modules corresponding to the display modules, the driving modules are arranged between the mounting board and the corresponding display modules and coupled to the mounting board and the display modules respectively, and the control module is coupled to the driving modules and controls the driving modules to drive the corresponding display modules to extend.

In one embodiment, the control module is further arranged to control the driving modules to drive the corresponding display modules to retract.

In another embodiment, a positioning protrusion is arranged on a side of the display modules facing the mounting board, and a positioning hole corresponding to the positioning protrusion is arranged on the mounting board.

In yet another embodiment, the mounting board and the display modules are respectively provided with corresponding limiting modules for limiting movement of the display modules in a direction perpendicular to the mounting board in a range.

In yet another embodiment, the driving modules comprise an asynchronous motor and a coupling unit. The coupling unit is coupled to the asynchronous motor and the corresponding display modules respectively, and the asynchronous motor is arranged to drive the corresponding display modules to extend and retract through the coupling unit.

In yet another embodiment, the driving modules comprise a self-locking switch, a lever and a power unit. The self-locking switch is arranged on the mounting board, and the lever is arranged between the display modules and the self-locking switch to engage with the self-locking switch, and the power unit is coupled to the lever for powering the lever.

In yet another embodiment, the driving modules comprise a hydraulic lifter and a lift unit. The hydraulic lifter is coupled to the lift unit and the control module respectively and drives the lift unit through the hydraulic pressure, and the lift unit is coupled to the corresponding display modules.

In yet another embodiment, the driving modules comprise a magnetic telescoping mechanism and a telescoping unit. The magnetic telescoping mechanism is coupled to the telescoping unit and the control module respectively and drives the telescoping unit through magnetic force, and the telescoping unit is coupled to the corresponding display modules.

In yet another embodiment, the mounting board is provided with a plurality of wireless receiving modules, each of which is coupled to one of the corresponding driving modules.

With such arrangement, when the display device is powered on, the control module is electrically coupled to the driving module such that the driving module receives a signal from the control module and controls the display module to extend in response to the signal; when the driving module is started, the corresponding display module moves along with the driving module and automatically extends, facilitating the automatic maintenance of the display device.

DETAILED DESCRIPTION OF THE INVENTION

The above described objects, features and advantages of the present invention will become more apparent from the aspects of the appended claims. Numerous specific details are set forth in the description below in order to provide a thorough understanding of the invention. However, the present invention can be implemented in many other ways than those described herein, and those skilled in the art can make similar modifications, and thus the invention is not limited by the specific embodiments disclosed below.

It should be noted that when an element is referred to as being "disposed on" another element, it may be directly on the other element or an intermediate element may be present. When an element is considered to be "coupled" or "connected" to another element, it can be directly coupled or connected to the other element or an intermediate element may be present. The terms "perpendicular", "horizontal", "left", "right", and the like, as used herein, are for the purpose of illustration and are not intended to limit the embodiment.

All technical and scientific terms used herein have the same meaning as commonly understood by a skilled person in the art, unless otherwise defined. The terminology used in the description of the present invention is for the purpose of describing particular embodiments and is not intended to limit the invention. The term "and/or" used herein includes any and all combinations of one or more of the associated listed items.

Figure 1:
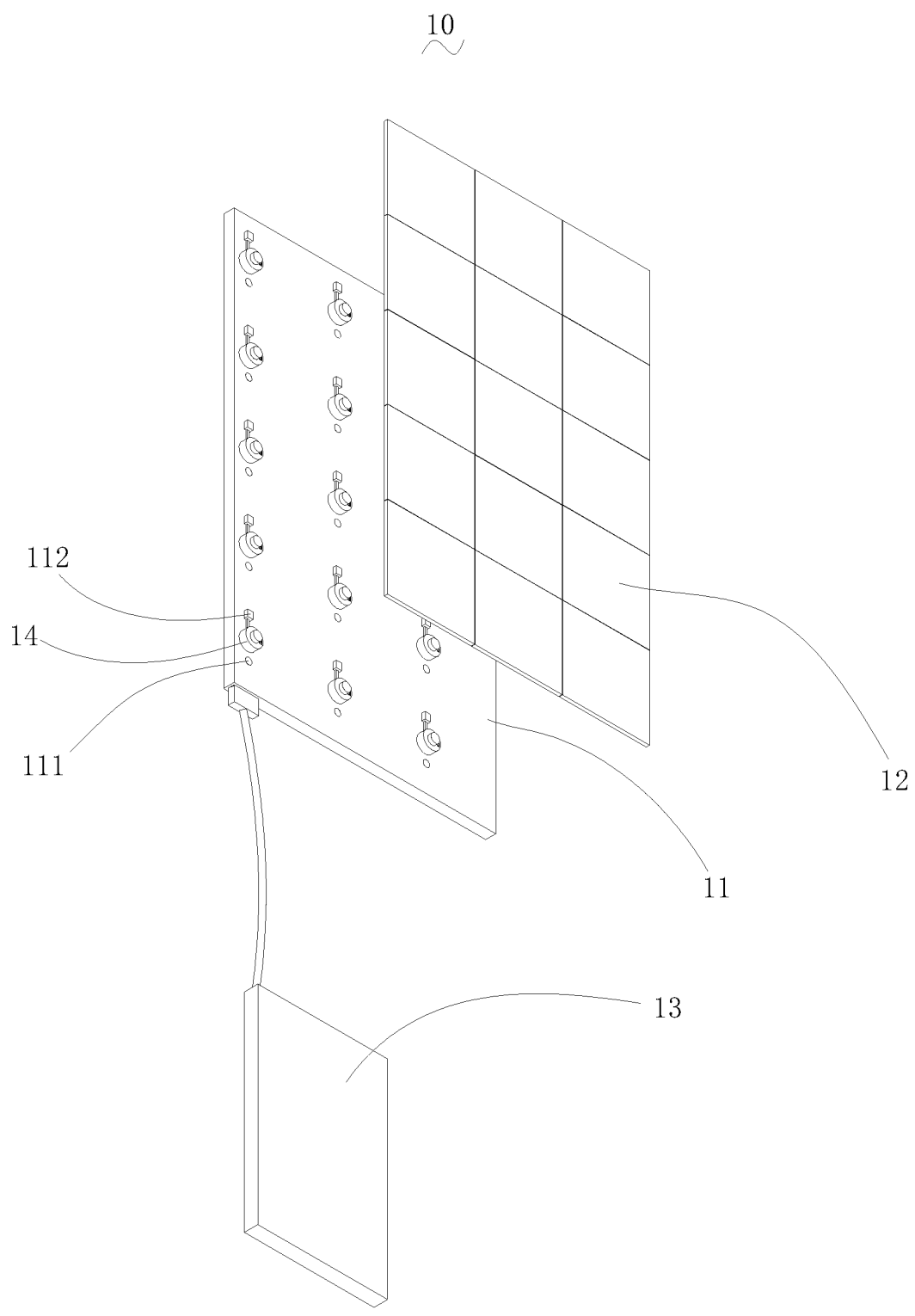
FIG. 1 shows the structure of the display device in accordance with an embodiment.

FIG. 1 shows the structure of the display device in accordance with an embodiment. As shown in FIG. 1, a display device 10 comprising a mounting board 11 and a display panel mounted on the mounting board and comprising a plurality of display modules 12 arranged in an array, wherein:

the display device 10 further comprises a control module 13 and a plurality of driving modules 14 corresponding to the display modules 12, the driving modules 14 are arranged between the mounting board 11 and the corresponding display modules 12 and coupled to the mounting board 11 and the display modules 12 respectively, and the control module 13 is coupled to the driving modules 14 and controls the driving modules 14 to drive the corresponding display modules 12 to extend.

In such embodiment, a plurality of display modules 12 constitute a display panel. Each of the display modules 12 is correspondingly coupled to one of the driving modules 14 arranged on the mounting board 11, that is, each of the driving modules 14 controls movement of one display module 12. The driving module 14 causes the display module 12 correspondingly coupled to it to move away from the mounting board 11 and extend, depending on the way it drives. In this way, when the display device is powered on, the control module 13 is electrically coupled to the driving module 14 such that the driving module 14 receives a signal from the control module 13 and controls the display module 12 to extend in response to the signal; when the driving module 14 is started, the corresponding display module 12 moves along with the driving module 14 and automatically extends such that the corresponding display module 12 is away from the mounting board 11, that is, the corresponding display module 12 protrudes from the mounting board 11, i.e. projects beyond the mounting board 11, facilitating maintenance of a specified display module 12 from the back and achieving automatic maintenance of the display panel. Therefore, it makes the front-end maintenance of the display device simple and avoids damage to the display panel due to the manual maintenance. In this instance, the control module 13 selects a specified display module 12 through a chip, and then controls, via the driving module 14, the specified display module 12 to extend, thus implementing the control of the specified display module 12 and preventing the entire display panel from extending. Further, the extension of the specified display module 12 enables a target-oriented maintenance more convenient and faster, thereby reducing the maintenance time and improving the maintenance efficiency.

The control module 13 is further arranged to control the driving modules 14 to drive the corresponding display modules 12 to retract, for use after the maintenance of the display modules 12. The driving modules 14 are capable not only of controlling the corresponding display module 12 to extend, but also of controlling the corresponding display module 12 to retract. In this embodiment, the control module 13 is a host computer, which controls the driving module 14 through the control software therein. In this way, the maintenance personnel may control the specified driving module 14 through the control software provided in the control module 13, thereby controlling the specified display module 12. The control module 13 is provided with a plurality of modes of control, including an extending mode and a retracting mode. When the specified display module 12 needs to be maintained, the maintenance personnel selects the corresponding driving module 14 through the control module 13 and selects the extending mode through the built-in control software to control the movement of the specified driving module 14, causing the corresponding display module 12 to extend, that is, the corresponding display module 12 gradually moves away from the mounting board 11. When the driving module 14 moves to a predetermined position or the maximum position where the driving module 14 is unable to continue moving away from the mounting board 11, the driving module 14 stops moving such that the corresponding display module 12 extends to a predetermined position or a position farthest from the mounting plate 11, facilitating maintenance personnel to perform maintenance on the specified display module 12 from the back. When maintenance is completed, the maintenance personnel selects retracting mode through the control module 13 and then the specified driving module 14 moves to the initial position such that the specified display module 12 gradually approaches the mounting board 11. When the driving module 14 moves to the initial position where the driving module 14 is unable to continue moving towards the mounting board 11, the driving module 14 stops moving and retracts to the initial position such that the extended display panel retracts to the initial position and the entire display panel is restored to a flat plane for use.

In addition, the control module 13 is provided with a prohibition function. After the completion of maintenance, the maintenance personnel may send a prohibition signal to all of the driving modules 14 via the control module 13 such that all of the driving modules 14 are turned off so as to prevent a user from accidentally touching the control module 13 and causing the display module 12 to extend. For subsequent re-maintenance, control of the driving module 14 may be resumed by re-powering, i.e. restarting the control module 13.

Figure 2:
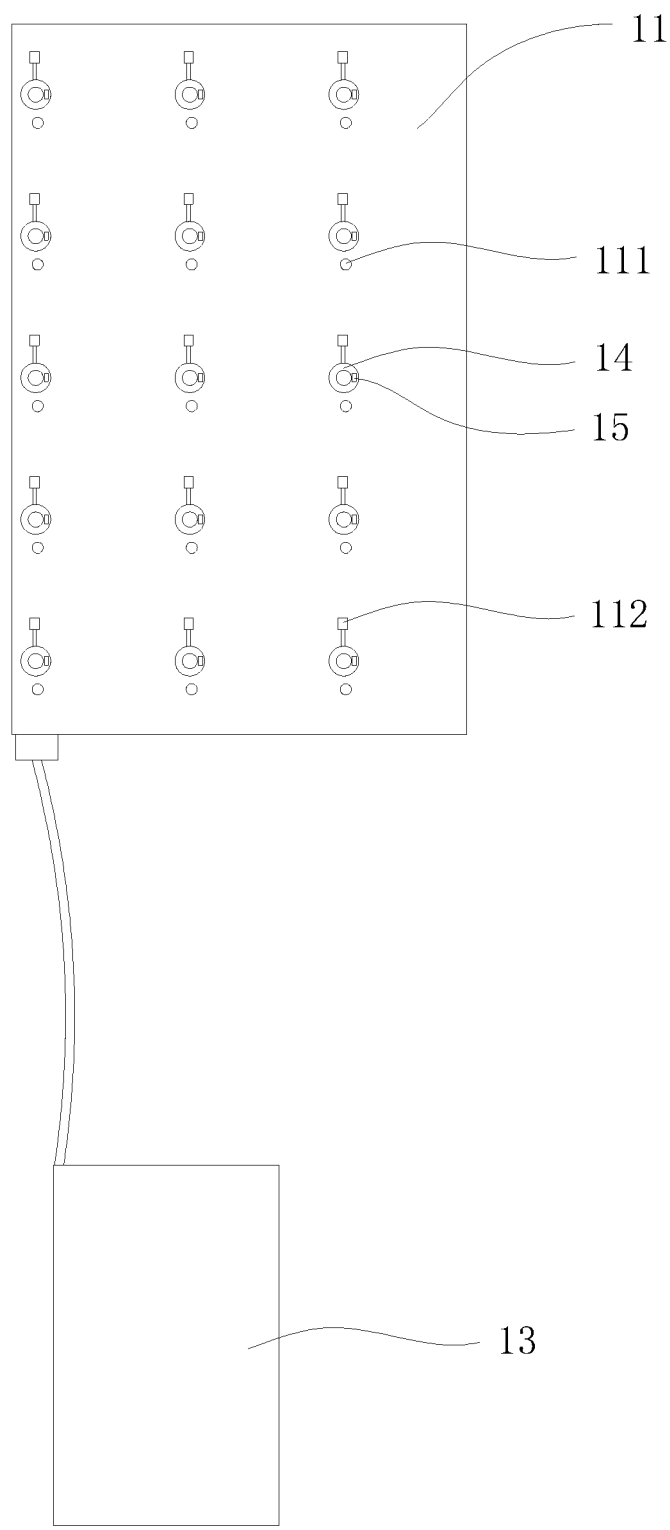
FIG. 2 shows the structures of the mounting board and the control module shown in FIG. 1.
Figure 3:
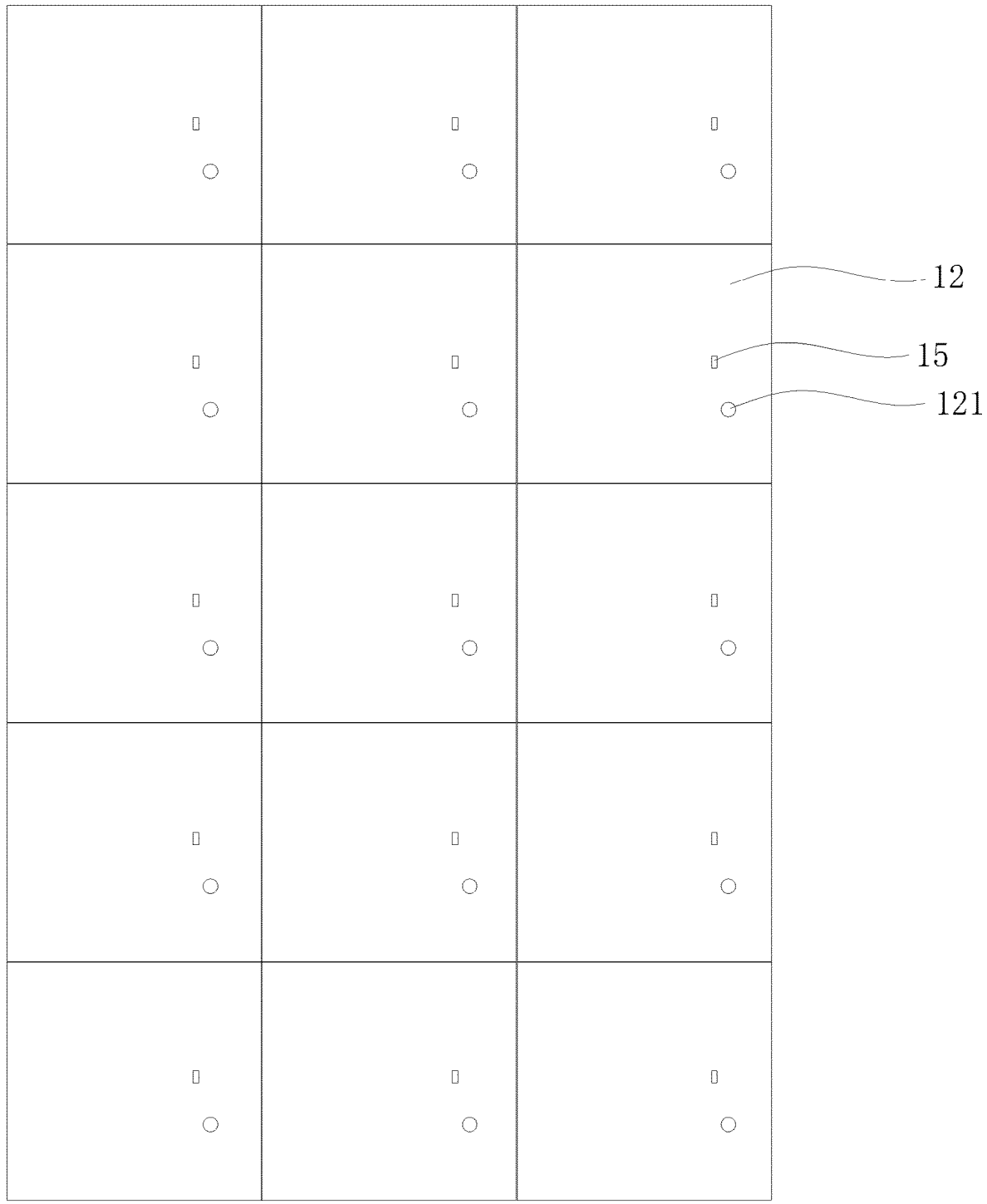
FIG. 3 shows the structure of the display panel shown in FIG. 1.

Referring to FIGS. 1-3, in order to prevent the display module 12 from moving in a direction parallel to the mounting board 11, a positioning protrusion 121 is arranged on a side of the display module 12 facing the mounting board 11, and a positioning hole 111 corresponding to the positioning protrusion 121 is arranged on the mounting board 11. The positioning hole 111 is arranged to receive the corresponding positioning protrusion 121, and each of the positioning protrusions 121 corresponds to one of the positioning holes 111, that is, each of the positioning protrusions 121 is arranged opposite to one of the positioning holes 111. During the retraction of the display module 12, the display module 12 gradually approaches the mounting board 11, with the positioning protrusion 121 on the display module 12 facing the corresponding positioning hole 111. When the positioning protrusion 121 is in the positioning hole 111, the positioning protrusion 121 abuts against the inner wall of the positioning hole 111 and the positioning hole 111 receives the positioning protrusion 121 such that the positioning protrusion 121 is limited within the positioning hole 111, providing a stable arrangement of the display module 12 on the mounting board 11 and preventing the display module 12 moving in the plane of the mounting board 11, that is, preventing the display module 12 moving in a direction parallel to the mounting board 11, and limiting the range in which the display module 12 moves in a direction parallel to the mounting board 11. In another embodiment, the positioning hole 111 is arranged on a side of the display module 12 facing the mounting board 11, while the corresponding positioning protrusion 121 is arranged on the mounting board 11. Similarly, the positioning protrusion 121 in this embodiment mates with the positioning hole 111. Since they work in the same way, they are not repeated here.

Referring to FIGS. 2-3, due to the positional offset of the display module 12, the mounting board 11 and the display modules 12 are respectively provided with corresponding limiting modules 15 for limiting movement of the display modules 12 in a direction perpendicular to the mounting board 11 in a range. The two limiting modules generate interaction force between the mounting board 11 and the display module 12 such that the display module 12 retracts accurately and avoids collision with the adjacent display module 12 due to the deviation during the retraction. For example, the two limiting modules are arranged to generate a force that attracts each other; for example, one of the limiting modules is a magnet and the other one is an iron sheet; for example, the two limiting modules are magnet with opposite poles. In this way, the two limiting modules produce a magnetic field between the display module 12 and the mounting board 11. Due the magnetic force on the iron sheet or the magnet, the display module 12 is subjected to a magnetic force that draws it to the mounting board 11 and tends to move towards the mounting board 11. The magnetic force between the display module 12 and the mounting board 11 enables the display module 12 to accurately retain in a direction perpendicular to the mounting board 11 during the extension or retraction. As a result, the movement of the display module 12 in a direction perpendicular to the mounting board 11 is limited in a range, thus avoiding the positional offset of the display module 12.

In this embodiment, the driving module is arranged to control the extension and retraction of the display module. The way the driving modules drive varies according to the driving devices with different power sources.

Figure 4:
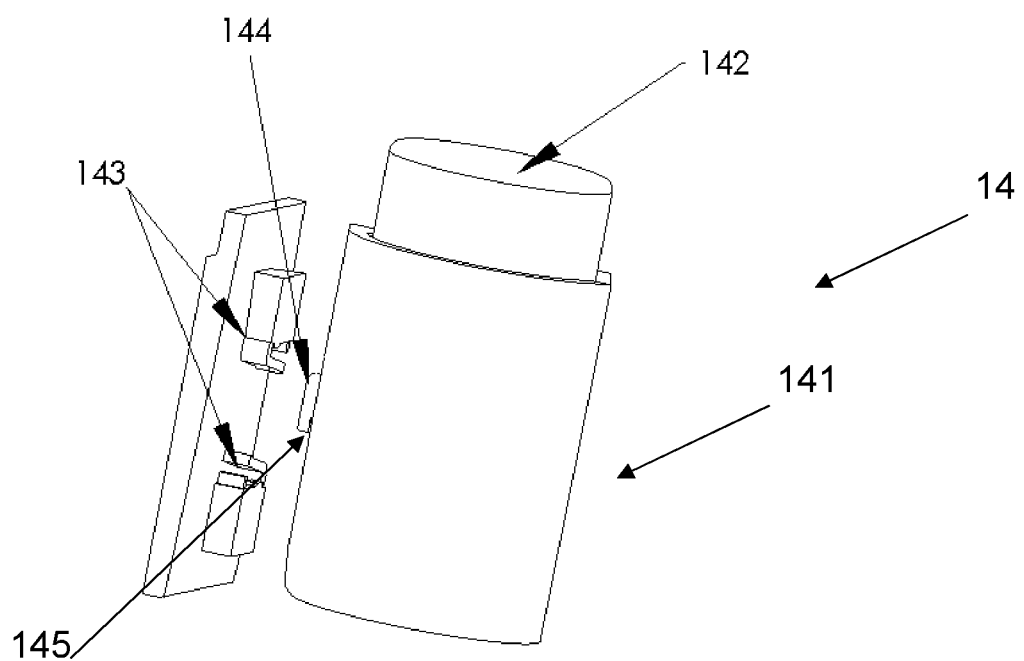
FIG. 4 shows the structure of a driving module of the display device of FIG. 1.

For example and referring to FIG. 4, the driving modules comprise an asynchronous motor 141 and a coupling unit 142. The coupling unit 142 is coupled to the asynchronous motor 141 and the corresponding display modules respectively, and the asynchronous motor 141 is arranged to drive the corresponding display modules to extend and retract through the coupling unit 142. The asynchronous motor 141 has four operating conditions, that is, a rotating shaft of the asynchronous motor 141 has four rotation conditions, namely forward rotation, reverse rotation, stop, and standby. The rotating shaft of the asynchronous motor 141 is coupled to the coupling unit 142. With the inner mechanism of the coupling unit 142, rotation of the rotating shaft of the asynchronous motor 141 causes the display module to extend and retract correspondingly. For example, the rotating shaft of the asynchronous motor 141 rotates forward, and then the display module gradually moves away from the mounting board and extends; for example, the rotating shaft of the asynchronous motor 141 rotates reversely, and then the display module gradually approaches the mounting board and retracts; for example, the rotating shaft of the asynchronous motor 141 stops rotating, and the display module extends to the distal end; for example, when the asynchronous motor 141 is on standby, the display module retracts to the initial position. In this embodiment, the control module controls rotation direction rotation of rotating shaft of the asynchronous motor 141. When the display module is extended to the distal end, the rotating shaft of the asynchronous motor 141 stops rotating; when the display module needs to be retracted, the control module controls the limiting switch to alter the rotation direction of rotating shaft of the asynchronous motor 141, that is, the limiting switch reverses the rotation of the shaft of the asynchronous motor 141. In this way, the control module causes the display module to extend and retract by controlling the rotating shaft of the asynchronous motor 141 to rotate forward or reversely.

For example, the driving modules comprise a self-locking switch 143, a lever 144 and a power unit 145. The self-locking switch 143 is arranged on the mounting board, and the lever 144 is arranged between the display module and the self-locking switch 143 to engage with the self-locking switch 143, and the power unit 145 is coupled to the lever 144 for powering the lever 144. One end of the lever 144 is connected to the display module, and the other end of the lever 144 is provided with an engagement portion for extending into or out of the interior of the self-locking switch 143. The power unit 145 provides power to the lever 144 for moving, causing the display module to extend and retract. When maintenance is required, that is, the display module extends, the power unit 145 applies within a predetermined time a force that pulls on the lever 144 and draws it to the mounting board, thus unlocking the self-locking switch 143. The power unit 145 then applies to the lever 144 a force that draws it away from the mounting plate such that the lever 144 is away from the mounting plate, thus realizing the extension of the display module. When the maintenance is completed, the power unit 145 applies to the lever 144 a force that draws it to the mounting board and forces the engagement portion of the lever 144 to extend into the interior of the self-locking switch 143 and engage with the self-locking switch 143, so that the lever 144 is fixed inside the self-locking switch 143, thereby realizing the retraction of the display module. The power unit 145 is also coupled to the control module, which controls the direction, duration and strength provided by the power unit 145, so that the lever 144 drives the display module to extend and retract.

Figure 5:
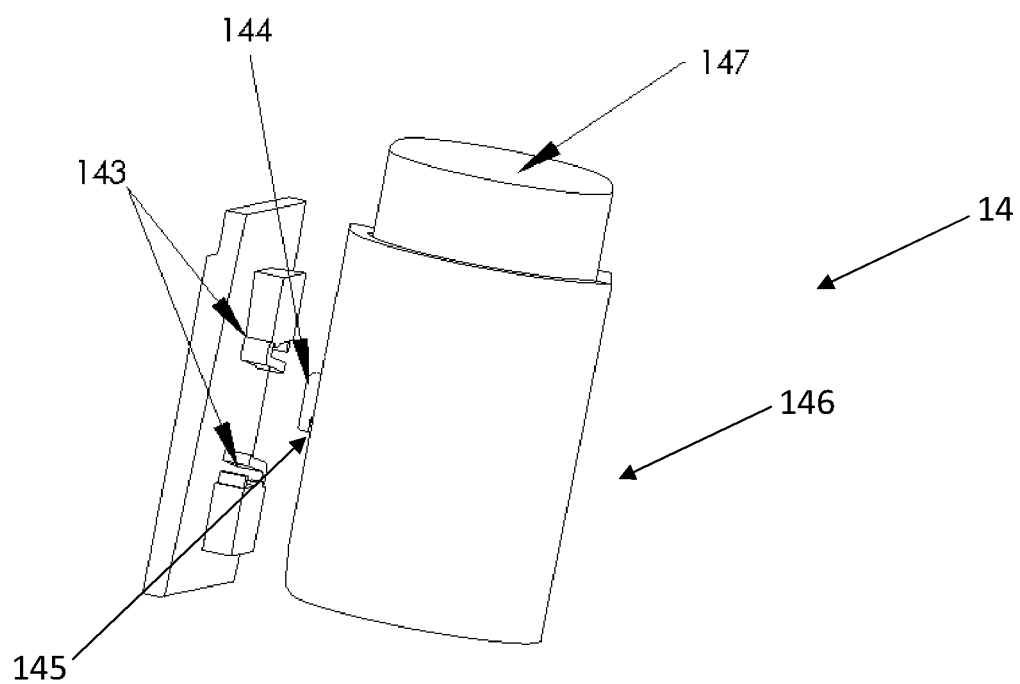
FIG. 5 shows the structure of another driving module of the display device of FIG. 1.

In some embodiments and referring to FIG. 5, the driving modules comprise a hydraulic lifter 146 and a lift unit 147. The hydraulic lifter 146 is coupled to the lift unit 147 and the control module respectively and drives the lift unit 147 through the hydraulic pressure, and the lift unit 147 is coupled to the corresponding display module. The hydraulic lifter 146 provides the lift unit 147 with hydraulic pressure power. The change of hydraulic pressure provides power, and the lift unit 147 drives the display module to move along with it. When the hydraulic lifter 146 provides the lift unit 147 with hydraulic pressure that forces the lift unit 147 to move away from the mounting board, the display module extends; when the hydraulic lift provides the lift unit 147 with hydraulic pressure that forces the lift unit 147 to move towards the mounting board, the display module retracts. In this way, hydraulic pressure causes the lift unit 147 to lift, which facilitates the extension and retraction of the display module.

Figure 6:
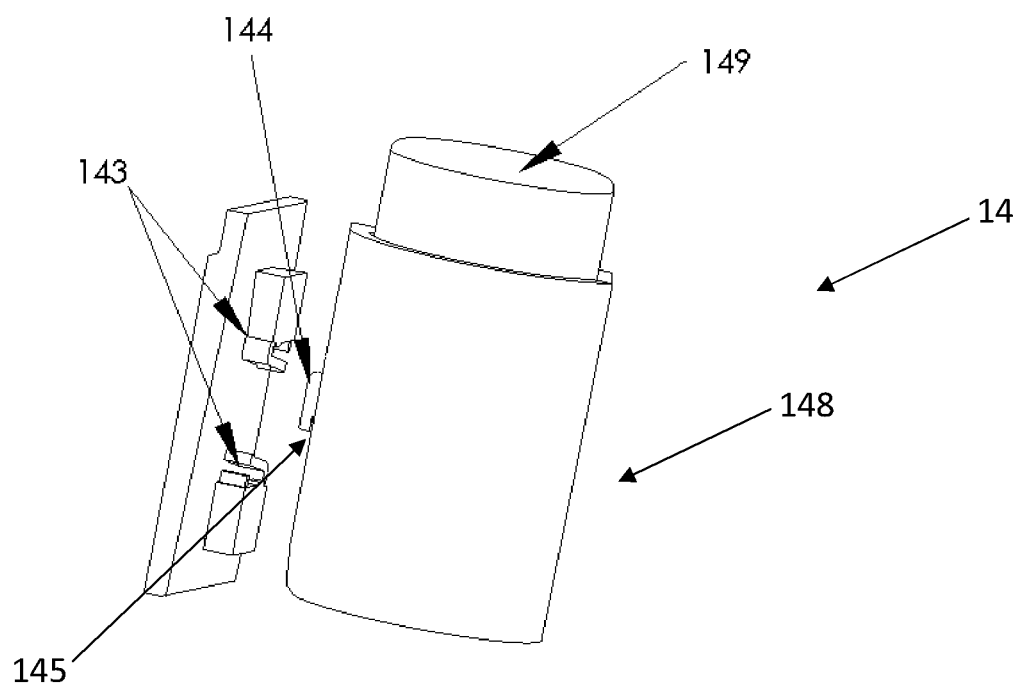
FIG. 6 shows the structure of another driving module of the display device of FIG. 1.

In another embodiment and referring to FIG. 6, the driving modules drive the display modules through a magnetic field to extend and retract. The driving modules comprise a magnetic telescoping mechanism 148 and a telescoping unit 149. The magnetic telescoping mechanism 148 is coupled to the telescoping unit 149 and the control module respectively and drives the telescoping unit 149 through magnetic force, and the telescoping unit 149 is coupled to the corresponding display modules. The magnetic telescoping mechanism 148 generates a magnetic force to drive the telescoping unit 149 to extend and retract, and the display modules extend and retract with the telescopic unit. When the magnetic telescoping mechanism 148 generates a positive magnetic field, the telescoping unit 149 drives the display module to extend; when the magnetic telescoping mechanism 148 generates a negative magnetic field, the telescoping unit 149 drives the display module to retract. In this way, the alteration of the direction of the magnetic field generated by the magnetic telescoping mechanism 148 may cause the display module to extend and retract.

Referring to FIGS. 1-2, the mounting board 11 is provided with a plurality of wireless receiving modules 112, each of which is coupled to one of the corresponding driving modules 14, such that the display modules 12 may be maintained in more ways. The wireless receiving modules 112 are arranged to receive an external control signal, for example, a control signal from a bracelet. The wireless receiving modules 112 include a Hall element, which transmits the received control signal to the driving modules 14, and the driving modules 14 then drive the display module 12 to extend and retract in response to the control signal. In this embodiment, the control signal from the bracelet is an electromagnetic signal. When the bracelet is in close proximity to the corresponding display module 12, the control signal is transmitted to the corresponding wireless receiving module 112, thereby controlling the corresponding driving module 14 to move and causing the display module 12 to extend or retract. In this way, the control signal is transmitted to the driving module 14 through the wireless receiving module 112 such that the driving module 14 drives the corresponding display module 12 to extend or retract. Therefore, the display module 12 may be maintained in more ways. With this arrangement, it is possible for maintenance personnel to maintain the corresponding display module 12 through the wireless receiving module 112, in the case of failure of the control module 13.

In this embodiment, when the driving modules 14 are in the driving state, the display modules 12 display a specific light, that is, the display modules 12 emit light of a particular color, so that the maintenance personnel recognize and reach the position of the specified display module 12 that needs to be maintained in a short time, thereby reducing maintenance time and improving maintenance efficiency.

Any combination of the technical features of the above-described will be allowable. All possible combinations of the technical features in the above embodiments are not described. However, as long as there is no contradiction between the technical features, their combination should be considered within the scope of this description.

It should be noted that the above implementations are only used to explain the technical solutions of the present application, and are not limited thereto. Those skilled in the art should understand that the modifications or equivalent substitutions of the present application are not intended to be excluded from the scope of the invention.

What is claimed is:

1. A display device comprising a mounting board and a display panel mounted on the mounting board and comprising a plurality of display modules arranged in an array, wherein:
the display device further comprises a control module and a plurality of driving modules corresponding to the display modules,
the driving modules are arranged between the mounting board and the corresponding display modules and coupled to the mounting board and the display modules respectively, and
the control module is coupled to the driving modules and controls the driving modules to drive the corresponding display modules to extend, and
wherein the driving modules comprise a self-locking switch, a lever and a power unit,
the self-locking switch is arranged on the mounting board,
the lever is arranged between the display modules and the self-locking switch to engage with the self-locking switch, and
the power unit is coupled to the lever for powering the lever.

2. The display device according to claim 1, wherein the control module is further arranged to control the driving modules to drive the corresponding display modules to retract.

3. The display device according to claim 1, wherein:
a positioning protrusion is arranged on a side of the display modules facing the mounting board, and
a positioning hole corresponding to the positioning protrusion is arranged on the mounting board.

4. The display device according to claim 1, wherein the mounting board and the display modules are respectively provided with corresponding limiting modules for limiting movement of the display modules in a direction perpendicular to the mounting board in a range.

5. The display device according to claim 1, wherein:
the driving modules comprise an asynchronous motor and a coupling unit,
the coupling unit is coupled to the asynchronous motor and the corresponding display modules respectively, and
the asynchronous motor is arranged to drive the corresponding display modules to extend and retract through the coupling unit.

6. The display device according to claim 1, wherein:
the driving modules comprise a hydraulic lifter and a lift unit,
the hydraulic lifter is coupled to the lift unit and the control module respectively and drives the lift unit through the hydraulic pressure, and
the lift unit is coupled to the corresponding display modules.

7. The display device according to claim 1, wherein:
the driving modules comprise a magnetic telescoping mechanism and a telescoping unit,
the magnetic telescoping mechanism is coupled to the telescoping unit and the control module respectively and drives the telescoping unit through magnetic force, and
the telescoping unit is coupled to the corresponding display modules.

8. The display device according to claim 1, wherein the mounting board is provided with a plurality of wireless receiving modules, each of which is coupled to one of the corresponding driving modules.

* * * * *